(12) United States Patent
Park et al.

(10) Patent No.: US 9,991,299 B2
(45) Date of Patent: Jun. 5, 2018

(54) IMAGE SENSORS

(71) Applicant: Samsung Electronics Co., Ltd., Suwon-si, Gyeonggi-do (KR)

(72) Inventors: Jongeun Park, Seongnam-si (KR); Yitae Kim, Hwaseong-si (KR); Donghyuk Park, Yongin-si (KR); Jungchak Ahn, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/290,661

(22) Filed: Oct. 11, 2016

(65) Prior Publication Data

US 2017/0104021 A1    Apr. 13, 2017

(30) Foreign Application Priority Data

Oct. 12, 2015    (KR) .................. 10-2015-0142312

(51) Int. Cl.
*H01L 31/062*    (2012.01)
*H01L 27/146*    (2006.01)

(52) U.S. Cl.
CPC .. *H01L 27/14614* (2013.01); *H01L 27/14621* (2013.01); *H01L 27/14638* (2013.01); *H01L 27/14643* (2013.01)

(58) Field of Classification Search
CPC ......... H01L 27/14636; H01L 27/14643; H01L 27/14621; H01L 27/14627; H01L 27/1463
USPC ........................................... 257/294
See application file for complete search history.

(56) References Cited

U.S. PATENT DOCUMENTS

| | | | |
|---|---|---|---|
| 7,741,143 B2 | 6/2010 | Paik et al. | |
| 8,451,362 B2 | 5/2013 | Lee et al. | |
| 8,487,350 B2 | 7/2013 | Nozaki et al. | |
| 8,564,701 B2 | 10/2013 | Watanabe et al. | |
| 8,614,759 B2 | 12/2013 | Watanabe et al. | |
| 8,648,362 B2 | 2/2014 | Nakamura | |
| 8,658,956 B2 | 2/2014 | Venezia et al. | |
| 8,716,769 B2 | 5/2014 | Ihara et al. | |
| 8,829,578 B2 | 9/2014 | Maeda | |
| 8,946,794 B2 | 2/2015 | Ahn | |
| 8,956,908 B2 | 2/2015 | Hisanori | |
| 2006/0138486 A1 | 6/2006 | Lim | |
| 2011/0108897 A1* | 5/2011 | Koo | H01L 27/14609 257/292 |
| 2013/0221410 A1 | 8/2013 | Ahn | |
| 2013/0307040 A1* | 11/2013 | Ahn | H01L 27/1463 257/292 |
| 2014/0197464 A1 | 7/2014 | Hara | |
| 2015/0108555 A1 | 4/2015 | Jung et al. | |
| 2015/0115291 A1 | 4/2015 | Kim et al. | |

FOREIGN PATENT DOCUMENTS

JP    2011044544 A    3/2011
JP    2014199898 A    10/2014

* cited by examiner

*Primary Examiner* — Andy Huynh
(74) *Attorney, Agent, or Firm* — Myers Bigel, P.A.

(57)    ABSTRACT

An image sensor includes a substrate including an active region defined by a device isolation layer, a photoelectric conversion layer in the substrate, a floating diffusion region in the substrate at an edge of the active region, and a transfer gate on the active region. The transfer gate is in contact with a portion of the device isolation layer adjacent the active region.

18 Claims, 8 Drawing Sheets

IMAGE SENSORS

CROSS-REFERENCE TO RELATED APPLICATION

This U.S. non-provisional patent application claims priority under 35 U.S.C. § 119 to Korean Patent Application No. 10-2015-0142312, filed on Oct. 12, 2015, in the Korean Intellectual Property Office, the entire contents of which are hereby incorporated herein by reference.

BACKGROUND

The present disclosure relates to image sensors, and in particular, to CMOS image sensors.

An image sensor is a semiconductor device that converts optical images into electrical signals. Image sensor may be classified into one of two types: a charge coupled device (CCD) type and a complementary metal-oxide-semiconductor (CMOS) type. A CMOS-type image sensor (CIS) may include a plurality of two-dimensionally arranged pixels, each of which includes a photodiode (PD) that coverts incident light into an electrical signal.

As the integration density of image sensors increases, the size of each pixel or photodiode in the image sensor becomes smaller and smaller. This may lead to a reduction in the amount of light incident into each photodiode and a consequent deterioration in the sensitivity of the image sensor.

SUMMARY

Some embodiments of the inventive concepts provide highly sensitive image sensors with small sized pixels.

According to some embodiments of the inventive concepts, an image sensor may include a substrate including an active region defined by a device isolation layer, a photoelectric conversion layer in the substrate, a floating diffusion region in the substrate at an edge of the active region, and a transfer gate on the active region, the transfer gate being in contact with a portion of the device isolation layer adjacent the active region.

In some embodiments, the substrate may further include a well impurity layer, and the floating diffusion region and the transfer gate may be in the well impurity layer. The transfer gate may include a first portion inserted into the well impurity layer and a second portion connected to the first portion. The second portion may protrude from the substrate in a direction perpendicular to a main surface of the substrate.

In some embodiments, the active region is a first active region and the image sensor may include a second active region and a third active region. The first active region may be between the second and third active regions. The first active region may include first and second portions connected to each other. The floating diffusion region may be in the first portion of the first active region and the transfer gate may be in second portion of the first active region. The second portion of the first active region may include a first end portion at a side of the second portion that is opposite the first portion of the first active region, a second end portion that is adjacent the second active region, and a third end portion that is adjacent the third active region.

In some embodiments, the transfer gate may be in contact with a portion of the device isolation layer that is adjacent the first end portion of the second portion of the first active region.

In some embodiments, the transfer gate may be in contact with portions of the device isolation layer that are adjacent the first and third end portions of the second portion of the first active region.

In some embodiments, the transfer gate may be in contact with portions of the device isolation layer that are adjacent the first, second, and third end portions of the second portion of the first active region.

In some embodiments, the transfer gate may be in contact with the first end portion of the second portion of the first active region. The transfer gate may have a side that faces the first portion of the first active region and may be inclined relative to the first portion of the first active region.

In some embodiments, the second and third active regions may have a same width and length.

In some embodiments, the active region may include first and second portions connected to each other. The second portion may have a width greater than that of the first portion in a plan view, and the first portion may be in the floating diffusion region.

In some embodiments, the active region may be an 'L'-shaped structure in a plan view.

According to some embodiments of the inventive concepts, an image sensor may include a substrate including a plurality of pixel regions defined by a first device isolation layer, a transfer gate in the substrate, logic transistors on a first surface of the substrate, and a color filter layer and a micro lens on a second surface of the substrate opposite the first surface. At least one of the pixel regions may include a first active region, a second active region, and a third active region defined by a second device isolation layer, a photoelectric conversion layer in the substrate, a well impurity layer adjacent the first surface of the substrate, and a floating diffusion region in a first portion of the first active region. The transfer gate may be in a second portion of the first active region. The transfer gate may be in contact with a portion of the second device isolation layer adjacent the second portion of the first active region.

In some embodiments, the logic transistors may include gate electrodes on the second and third active regions.

In some embodiments, the first active region may be between the second and third active regions, the first portion of the first active region may have a first width that is smaller than a second width of the second portion of the first active region, and the first and second portions of the first active region may have sides that are coplanar.

In some embodiments, the second portion of the first active region may include a first end portion at a side of the second portion of the first active region that is opposite the first portion of the first active region, a second end portion that is adjacent the second active region, and a third end portion that is adjacent the third active region. The transfer gate may be in contact with a portion of the second device isolation layer that is adjacent the first end portion of the second portion of the first active region.

In some embodiments, the transfer gate may be in contact with a portion of the second device isolation layer that is adjacent the third end portion of the second portion of the first active region.

In some embodiments, the transfer gate may be in contact with portions of the second device isolation layer that are adjacent the second and third end portions of the second portion of the first active region.

In some embodiments, a side of the transfer gate facing the first portion of the first active region may be inclined relative to the first portion of the first active region.

According to some embodiments of the inventive concepts, an image sensor may include a substrate including a first surface and a second surface facing the first surface and a first device isolation layer in the substrate and extending between the first surface and the second surface that defines a pixel region. The pixel region may include a photoelectric conversion layer that is in the substrate between the first surface and the second surface, a second device isolation layer that is on the photoelectric conversion layer and between the photoelectric conversion layer and the first surface of the substrate, a transfer transistor that is on the substrate and configured to transfer a charge from the photoelectric conversion layer, and a transfer gate of the transfer transistor that is on the photoelectric conversion layer, the transfer gate comprising a first portion of the transfer gate that is in contact with the second device isolation layer.

In some embodiments, the pixel region may include a first active region, a second active region, and a third active region. The first active region may be between the second active region and the third active region, and the first active region may include the transfer gate.

In some embodiments, the pixel region may further include a floating diffusion region that is in the first active region and that is at a side of the transfer gate. The transfer gate may contact the second device isolation layer at a side of the transfer gate that is opposite the floating diffusion region.

In some embodiments, the transfer gate may contact the second device isolation layer at a first edge of the first active region. The floating diffusion region may be in the first active region at a second edge of the first active region that is opposite the first edge of the first active region, and the transfer gate may also contact the second device isolation layer at a third edge of the first active region that is adjacent the first edge of the first active region.

In some embodiments, the transfer gate may include a gate electrode with a side adjacent the floating diffusion region that comprises a first segment, a second segment and a third segment. The second segment of the side of the gate electrode may be inclined at an angle relative to the floating diffusion region, the first segment of the side of the gate electrode may be between the second segment and the second active region, and the third segment of the side of the gate electrode may be between the second segment and the third active region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
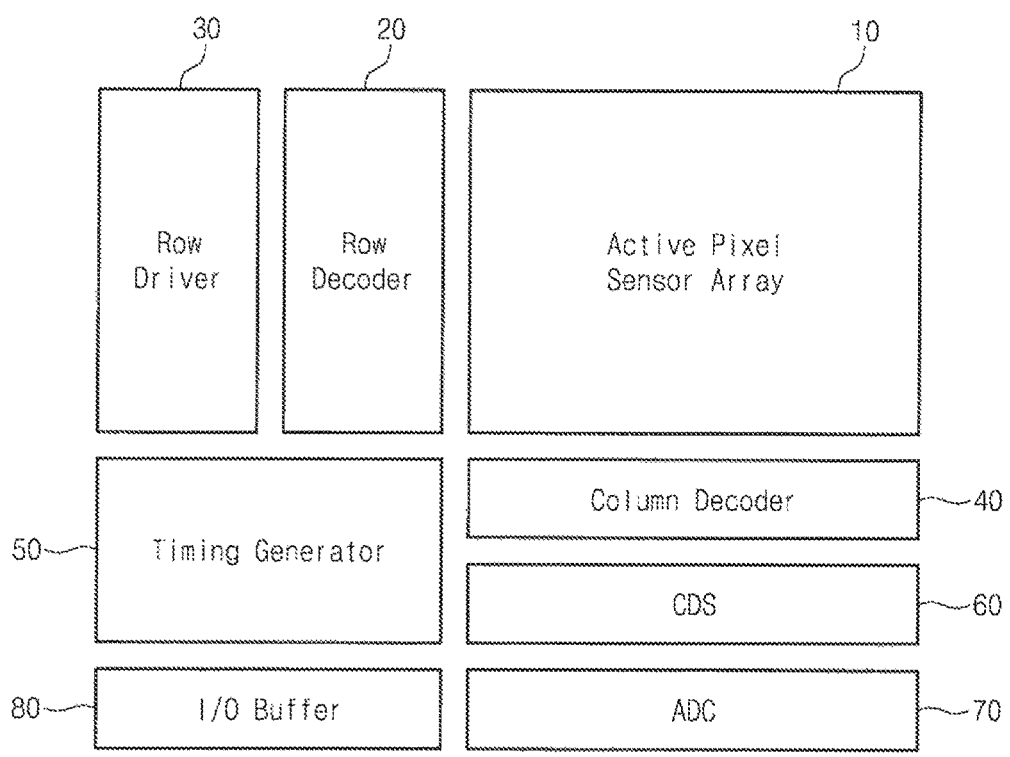
FIG. 1 is a block diagram illustrating an image sensor according to some embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which example embodiments of the inventive concepts are shown. The inventive concepts and methods of achieving them will be apparent from the following example embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

As used herein, the singular terms "a," "an," and "the" are intended to include the plural forms as well, unless the context clearly indicates otherwise. As used herein, the term "and/or" includes any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or gate structures, etc., as appropriate to the case) thereon, as would be illustrated by a plan view of the device/structure.

Example embodiments of aspects of the present inventive concepts explained and illustrated herein include their complementary counterparts. The same reference numerals or the same reference designators denote the same elements throughout the specification.

FIG. 1 is a block diagram illustrating an image sensor according to some embodiments of the inventive concepts.

Referring to FIG. 1, an image sensor may include an active pixel sensor array 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 may include a plurality of unit pixels that are two-dimensionally arranged and are configured to convert optical signals to electrical signals. The active pixel sensor array 10 may be driven by a plurality of driving signals, such as a pixel selection signal, a reset signal, and/or a charge transfer signal, which may be transmitted from the row driver 30. The converted electrical signal may be transmitted to the CDS 60.

The row driver 30 may provide a plurality of driving signals for driving a plurality of unit pixels to the active pixel sensor array 10 in accordance with the decoded result obtained from the row decoder 20. In embodiments where the unit pixels are arranged in a matrix shape, the driving signals may be applied to the respective rows.

The timing generator 50 may provide timing and control signals to the row decoder 20 and the column decoder 40.

The CDS 60 may receive the electrical signals generated in the active pixel sensor array 10, and the received electrical signals may be held and sampled in the CDS 60. The CDS 60 may perform a double sampling operation on a specific noise level and a signal level of the electrical signals and may output a difference level corresponding to a difference between the noise and signal levels.

The ADC 70 may be configured to convert analog signals, which may correspond to the difference level output from the CDS 60, into digital signals and then to output the converted digital signals.

The I/O buffer 80 may be configured to latch the digital signals output from the ADC 70 and then to output the latched digital signals to an image signal processing unit (not shown) sequentially in accordance with the decoding result obtained from the column decoder 40.

Figure 2:
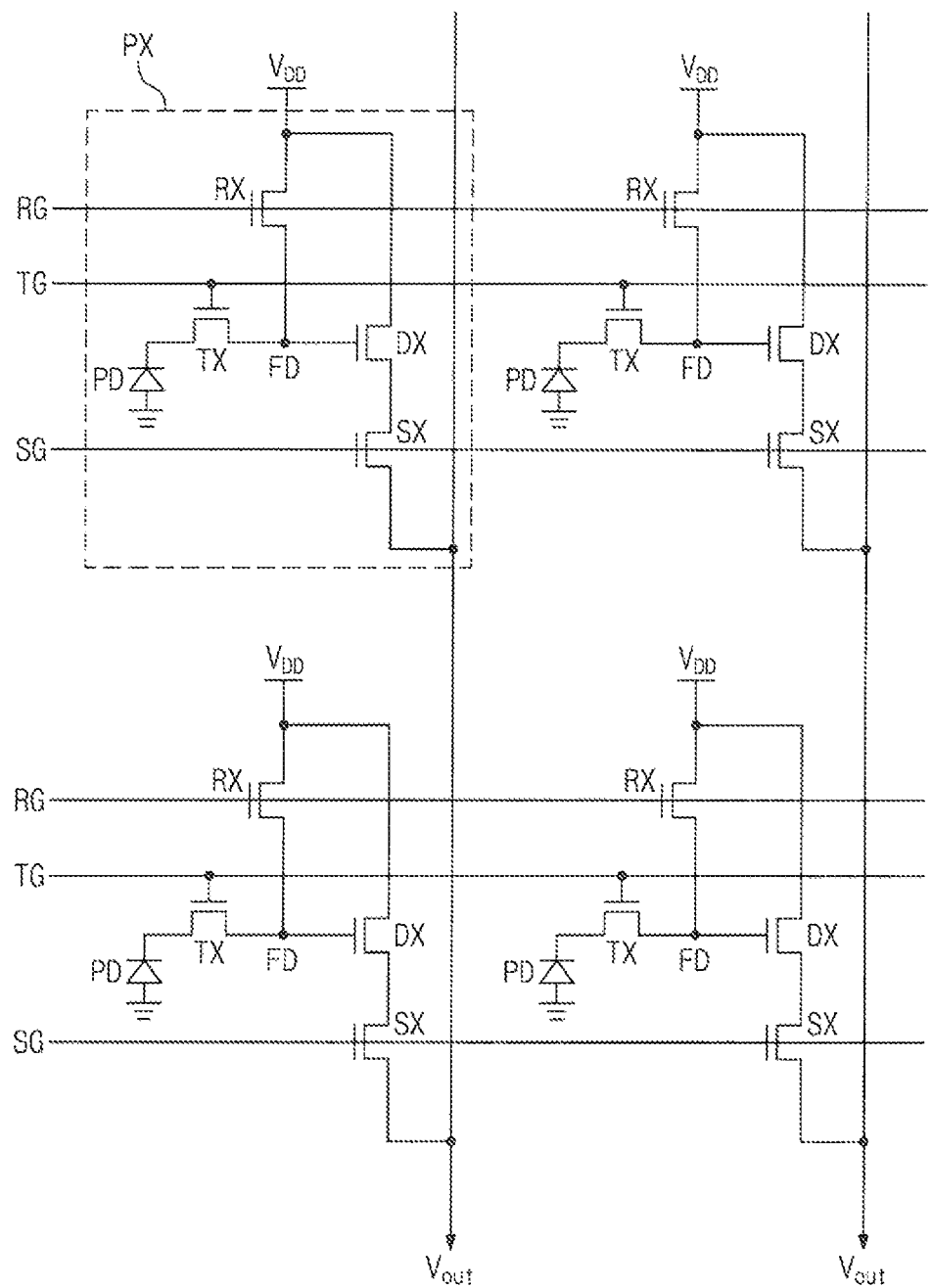
FIG. 2 is a circuit diagram of an active pixel sensor array of an image sensor according to some embodiments of the inventive concepts.

FIG. 2 is a circuit diagram of an active pixel sensor array 10 of an image sensor according to some embodiments of the inventive concepts.

Referring to FIGS. 1 and 2, the active pixel sensor array 10 may include a plurality of unit pixels PX, which are arranged in a matrix shape. In some embodiments, the unit pixel PX may include a transfer transistor TX and logic transistors RX, SX, and DX.

The logic transistors may include a reset transistor RX, a selection transistor SX, and a drive transistor or source follower transistor DX.

The transfer transistor TX may include a transfer gate TG, and may be connected to a photoelectric conversion device PD and a floating diffusion region FD.

The photoelectric conversion device PD may be configured to generate and hold a photocharge whose amount is in proportion to an amount of light incident therein. The photoelectric conversion device PD may be provided in the form of a photo diode, a photo transistor, a photo gate, a pinned photo diode (PPD), or any combination thereof.

The transfer gate TG may be configured to transfer the photocharge from the photoelectric conversion device PD to the floating diffusion region FD.

The photocharge generated in the photoelectric conversion device PD may be transmitted to, and stored, in the floating diffusion region FD. An amount of the photocharge to be stored in the floating diffusion region FD may be controlled by the drive transistor DX.

The reset transistor RX may be configured to periodically discharge the photocharge stored in the floating diffusion region FD. The reset transistor RX may include a reset gate RG as well as drain and source electrodes, which may be respectively connected to the floating diffusion region FD and a node applied with a power voltage VDD. The reset transistor RX may be activated by the reset gate RG. If the reset transistor RX is turned on, the power voltage VDD may be applied to the floating diffusion region FD through the source electrode of the reset transistor RX. Accordingly, the photocharge stored in the floating diffusion region FD may be discharged to the power voltage VDD through the reset transistor RX, thereby rendering the floating diffusion region FD in a reset state. As used herein, a transistor may be referred to as "turned on" when a voltage level applied to a gate of the transistor is equal to or greater than a threshold voltage of the transistor.

The drive transistor DX, in conjunction with an electrostatic current source (not shown) outside the unit pixel PX, may serve as a source follower buffer amplifier. In other words, the drive transistor DX may be used to amplify a variation in electric potential of the floating diffusion region FD and output the amplified signal to an output line Vout. A gate of the drive transistor DX may be connected to the floating diffusion region FD. A drain electrode of the drive transistor DX may be connected to the node applied with the power voltage VDD. A source electrode of the drive transistor DX may be connected to drain of the selection transistor SX.

The selection transistor SX may be used to select a row of the unit pixels PX to be read. The selection transistor SX may include a selection gate SG configured to activate the selection transistor SX. If the selection transistor SX is turned on, the power voltage VDD may be applied to the source electrode of the drive transistor DX.

Figure 3:
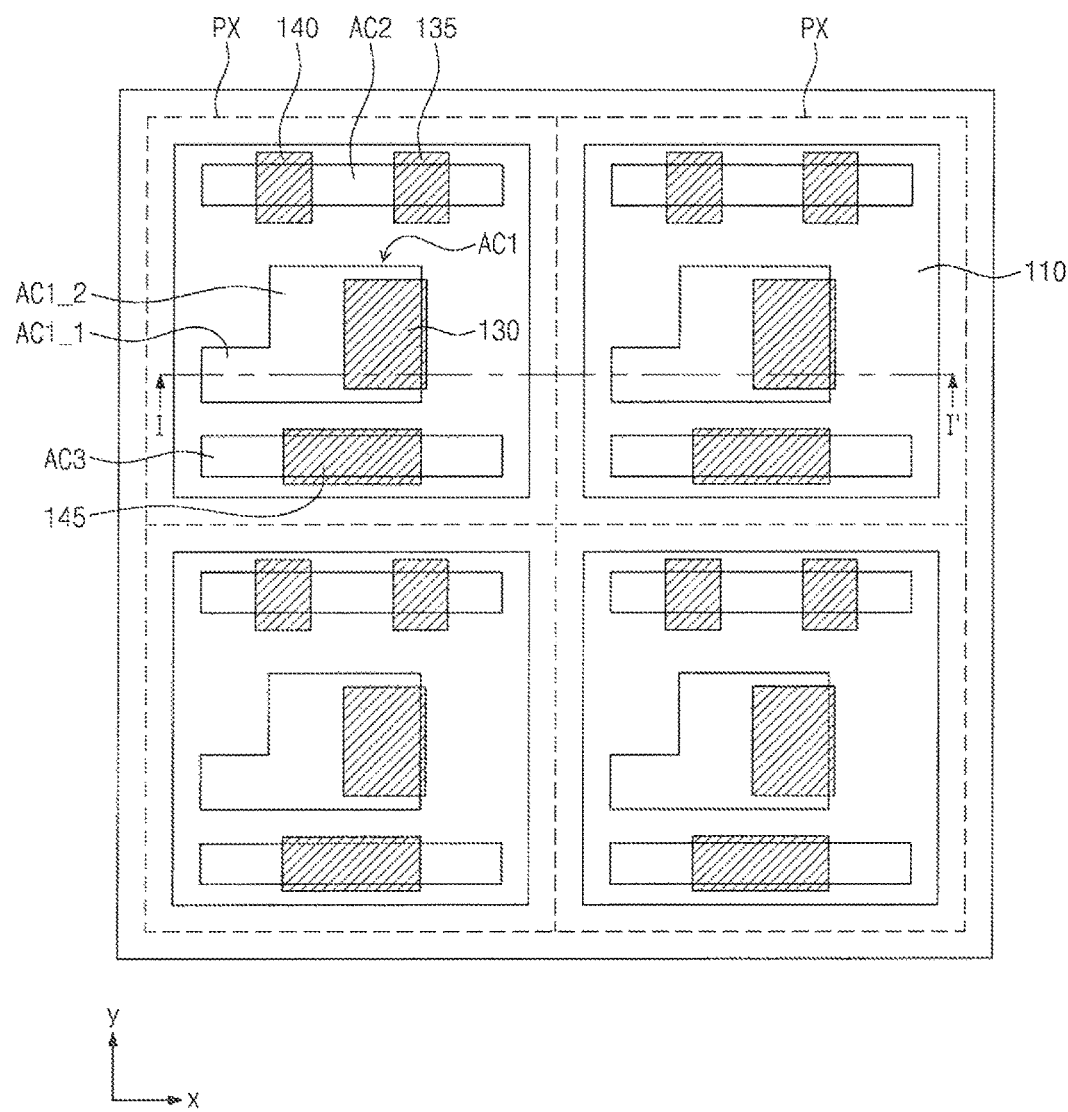
FIG. 3 is a plan view illustrating an image sensor according to some embodiments of the inventive concepts.
Figure 4:
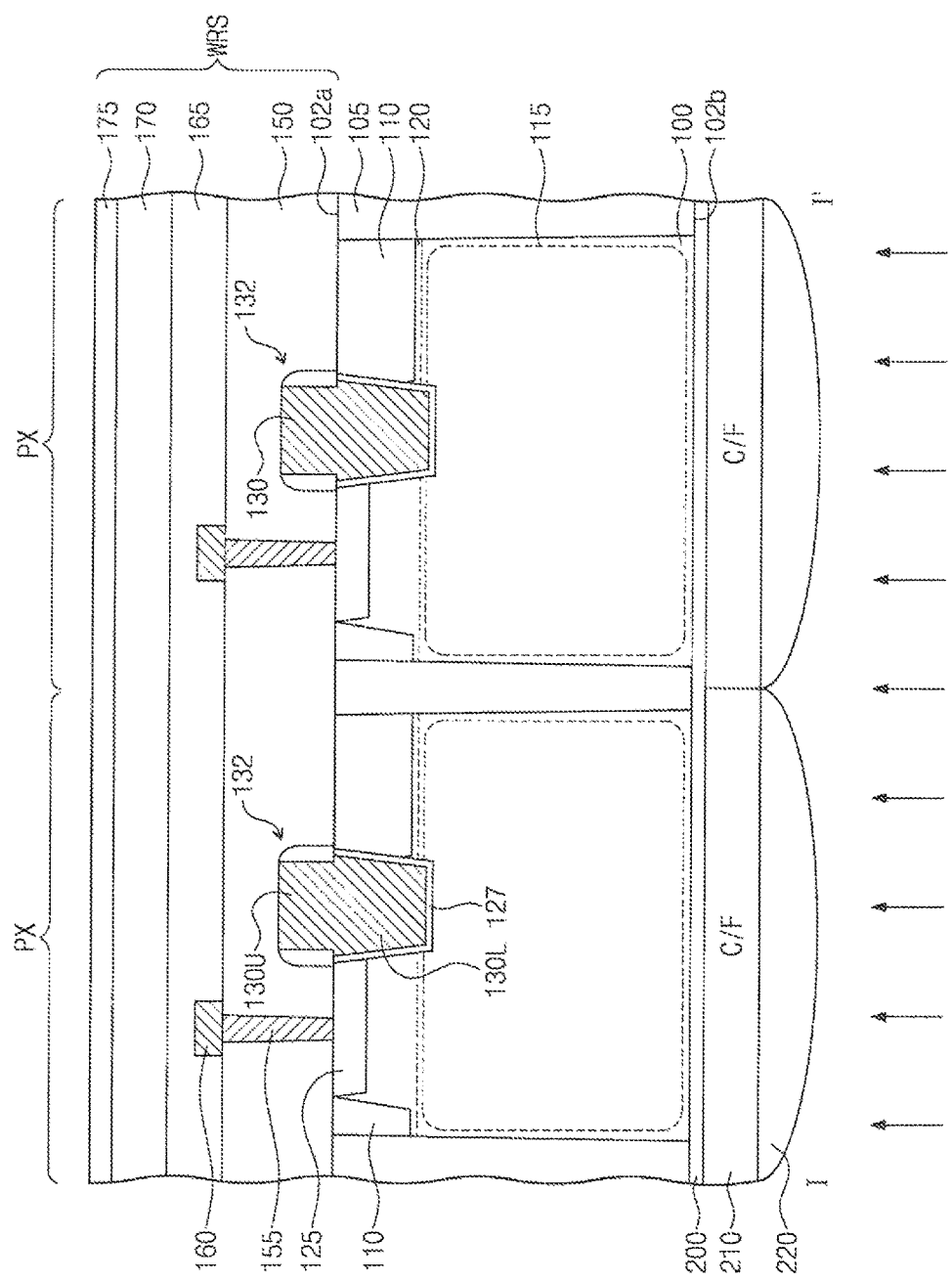
FIG. 4 is a sectional view taken along line I-I' of FIG. 3.

FIG. 3 is a plan view illustrating an image sensor according to some embodiments of the inventive concepts, and FIG. 4 is a sectional view taken along line I-I' of FIG. 3.

Referring to FIGS. 3 and 4, a substrate 100 may include a plurality of pixel regions PX. The pixel regions PX may be arranged in x- and y-directions. In some embodiments, each pixel region PX may include a first active region AC1, a second active region AC2 and a third active region AC3. When viewed in a plan view, the first active region AC1 may be disposed between the second active region AC2 and the third active region AC3.

The substrate 100 may be a semiconductor substrate including silicon, germanium, or silicon/germanium, a silicon-on-insulator (SOI) wafer, a germanium-on-insulator (GOI) wafer, or a substrate with a semiconductor epitaxial layer. Also, the substrate 100 may have a first surface 102a and a second surface 102b facing each other.

An interconnection structure WRS may be provided on the first surface 102a of the substrate 100. The interconnection structure WRS may include logic transistors (not shown) and an interconnection layer, which is connected to the logic transistors and includes contact plugs 155 and interconnection lines 160. A color filter layer 210 and micro lens 220 may be provided on the second surface 102b of the substrate 100. The color filter layer 210 and the micro lens 220 may be provided on respective ones of the pixel regions PX. The color filter layer 210 may include red, green or blue filters, whose color is dependent on a position of an underlying unit pixel. The micro lens 220 may be a convex structure and may be configured to focus the incident light on the pixel region PX. In certain embodiments, a flattening layer 200 may be further provided between the second surface 102b of the substrate 100 and the color filter layer 210.

Each of the pixel regions PX may include a photoelectric conversion layer 115 and a well impurity layer 120. The photoelectric conversion layer 115 may be configured to generate photocharges in proportion to an intensity of the incident light. The photoelectric conversion layer 115 may be formed by injecting impurities into the substrate 100 and may have a different conductivity type from the substrate 100. Furthermore, the photoelectric conversion layer 115 may be formed to have a difference in doping concentration between the regions adjacent the first and second surfaces 102a and 102b, and as a result, a potential difference may be produced between the first and second surfaces 102a and 102b of the substrate 100. For example, the photoelectric conversion layer 115 may include a plurality of vertically-stacked impurity regions. The well impurity layer 120 may be provided on the photoelectric conversion layer 115 and adjacent the first surface 102a of the substrate 100 and may be doped to have a different conductivity type from the photoelectric conversion layer 115. In some embodiments, the photoelectric conversion layer 115 may be doped to have an n-type conductivity, and the well impurity layer 120 may be doped to have a p-type conductivity.

A first device isolation layer 105 may extend vertically from the first surface 102a to the second surface 102b of the substrate 100. In some embodiments, the first device isolation layer 105 may be provided to define the pixel regions PX of the substrate 100 and to enclose the photoelectric conversion layer 115. The first device isolation layer 105 may be formed of an insulating material whose refractive index is lower than that of the substrate 100. For example, the first device isolation layer 105 may be formed of or include silicon oxide, silicon nitride, undoped polysilicon, air, or any combination thereof. The first device isolation layer 105 may be formed by patterning the first surface 102a and/or the second surface 102b of the substrate 100 to form a trench and then by filling the trench with an insulating material. The first device isolation layer 105 may be configured to substantially prevent generated photocharges from transferring from one of the pixel regions PX to a neighboring one of the pixel regions PX, such as, for example, through a random drift phenomenon. The first device isolation layer 105 may reflect or refract an incident light that is incident to the photoelectric conversion layer 115 at an angle.

A second device isolation layer 110 may be provided to define the first active region AC1, the second active region AC2, and the third active region AC3 in the pixel region PX. The first active region AC1, the second active region AC2, and the third active region AC3 may be spaced apart from each other and may have sizes different from each other. When viewed in a plan view, the first active region AC1 may be provided at a center region of the pixel region PX and may include a first portion AC1_1 and a second portion AC1_2 connected to each other. The first portion AC1_1 may protrude from the second portion AC1_2, and, when measured in the x direction, the second portion AC1_2 may have a width greater than that of the first portion AC1_1. In other words, when viewed in a plan view, the first active region AC1 may be an 'L'-shaped structure. The first active region AC1 may be provided between the second and third active regions AC2 and AC3, and when viewed in a plan view, the second and third active regions AC2 and AC3 may be disposed at edge regions, respectively, of the pixel region PX. The second and third active regions AC2 and AC3 may be provided to face each other and may have substantially the same width and length.

In some embodiments, the second device isolation layer 110 may be formed in the well impurity layer 120. When measured from the first surface 102a of the substrate 100, a vertical depth (i.e. perpendicular to the first surface 102a of the substrate 100) of the second device isolation layer 110 may be smaller than that of the first device isolation layer 105. As an example, a bottom surface of the second device isolation layer 110 may be positioned in the well impurity layer 120 and may be spaced apart from the photoelectric conversion layer 115.

In some embodiments, the formation of the second device isolation layer 110 may include patterning the first surface 102a of the substrate 100 to form a shallow trench, forming a silicon nitride liner to conformally cover the shallow trench, and forming an insulating material (e.g., high density plasma (HDP) oxide and undoped silicate glass (USG)) to fill the shallow trench covered with the silicon nitride liner.

A transfer gate 132 and a floating diffusion region 125 may be formed in the first active region AC1 of the pixel region PX. The transfer gate 132 may include a transfer gate electrode 130, and the transfer gate electrode 130 may include a lower portion 130L, which is inserted into the well impurity layer 120, and an upper portion 130U, which is connected to the lower portion 130L and protrudes upwardly from the first surface 102a of the substrate 100. The lower portion 130L of the transfer gate electrode 130 may be provided to pass through a portion of the well impurity layer 120. The lower portion 130L of the transfer gate electrode 130 may be partially inserted into the photoelectric conversion layer 115 beyond an interface between the transfer gate electrode 130 and the photoelectric conversion layer 115. In other words, the lower portion 130L of the transfer gate electrode 130 may have a lowermost surface that is below an uppermost surface of the photoelectric conversion layer 115. The transfer gate 132 may further include a gate insulating layer 127 interposed between the transfer gate electrode 130 and the substrate 100.

Hereinafter, a process of forming the transfer gate electrode 130 will be briefly described. A mask pattern (not shown) may be formed on the first active region AC1. The mask pattern may be formed of a material which has an etch selectivity with respect to silicon and oxide and can be easily removed. For example, the mask pattern may be formed of a photoresist material or silicon oxynitride (SiON). A trench (not shown) may be formed by etching the well impurity layer 120 using the mask pattern as an etch mask, and the trench may be expanded using an isotropic etching process. The expanded trench may be formed to expose at least a portion of the second device isolation layer 110. A gate insulating layer and a gate conductive layer may be sequentially formed in the expanded trench.

In certain embodiments, a process of forming the transfer gate electrode 130 may include forming the mask pattern, performing an etching process to form a trench, and sequentially forming a gate insulating layer and a gate conductive layer in the trench. The mask pattern may be formed to expose at least a portion of the second device isolation layer 110 adjacent the first active region AC1 and a first end portion 112a (e.g., of FIG. 7) of the first active region AC1.

In some embodiments, when viewed in a plan view, the transfer gate 132 may be shifted toward a side portion of the first active region AC1. In some embodiments, the transfer gate 132 may be provided to be in contact with a portion of the second device isolation layer 110 which is adjacent the second portion AC1_2 of the first active region AC1. In some embodiments, the transfer gate 132 may be provided so that a portion of the gate insulating layer 127 and/or the transfer gate electrode 130 of the transfer gate 132 is in contact with a portion of the second device isolation layer 110. This will be described in more detail below.

The floating diffusion region 125 may be formed in the well impurity layer 120 and at a side of the transfer gate 132. The floating diffusion region 125 may be formed in the protruding portion (e.g., the first portion AC1_1) of the first active region AC1. The floating diffusion region 125 may be formed by an ion implantation process and may have a different conductivity type from that of the well impurity layer 120. For example, the floating diffusion region 125 may be an n-type impurity region.

A reset gate 140 and a selection gate 135 may be provided on the second active region AC2 of the pixel region PX. A source follower gate 145 may be provided on the third active region AC3 of the pixel region PX. The reset gate 140, the selection gate 135 and the source follower gate 145 may be provided on the well impurity layer 120, and the gate insulating layer (not shown) may be interposed therebetween. In some embodiments, the second and third active regions AC2 and AC3 may have substantially the same width and depth.

A first interlayered insulating layer 150 may be provided on the first surface 102a of the substrate 100 to cover the transfer gate 132, the reset gate 140, the selection gate 135, and/or the source follower gate 145. A plurality of contact plugs 155 may be provided in the first interlayered insulating layer 150. In some embodiments, each of the contact plugs 155 may be electrically coupled to the floating diffusion region 125. Although not shown in detail, impurity regions may be formed at both sides of each of the reset gate 140, the selection gate 135, and the source follower gate 145, and the contact plugs 155 may be electrically connected to the impurity regions, respectively. Each of the contact plugs 155 may include a barrier metal layer and a metal layer. The barrier metal layer may be formed of or include a metal nitride layer (e.g., of titanium nitride ($Ti_xN_y$), tantalum nitride ($Ta_xN_y$), tungsten nitride ($W_xN_y$), hafnium nitride ($Hf_xN_y$), and/or zirconium nitride ($Zr_xN_y$)). The metal layer may be formed of or include at least one of tungsten (W), copper (Cu), hafnium (Hf), zirconium (Zr), titanium (Ti), tantalum (Ta), aluminum (Al), ruthenium (Ru), palladium (Pd), platinum (Pt), cobalt (Co), nickel (Ni), or conductive metal nitrides. In certain embodiments, a silicide layer may be formed between the contact plug 155 and the impurity region.

A second interlayered insulating layer 165 may be formed to cover the contact plugs 155, and interconnection lines 160 may be formed on and/or within the second interlayered insulating layer 165. The interconnection lines 160 may be electrically connected to the contact plugs 155. Each of the interconnection lines 160 may be formed of or include at least one of copper (Cu), aluminum (Al), tungsten (W), titanium (Ti), molybdenum (Mo), tantalum (Ta), titanium nitride (Ti$_x$N$_y$), tantalum nitride (Ta$_x$N$_y$), tungsten nitride (W$_x$N$_y$), hafnium nitride (Hf$_x$N$_y$), or alloys thereof.

A third interlayered insulating layer 170 and a passivation layer 175 may be provided on the second interlayered insulating layer 165.

Figure 5:
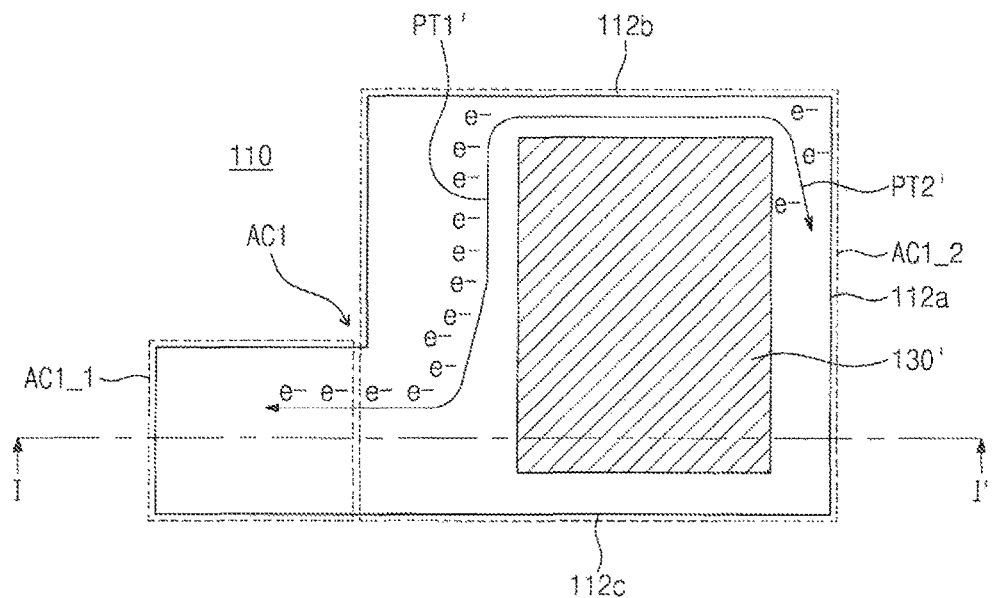
FIG. 5 is a plan view illustrating relative positions of an active region and a transfer gate of a conventional image sensor.
Figure 6:
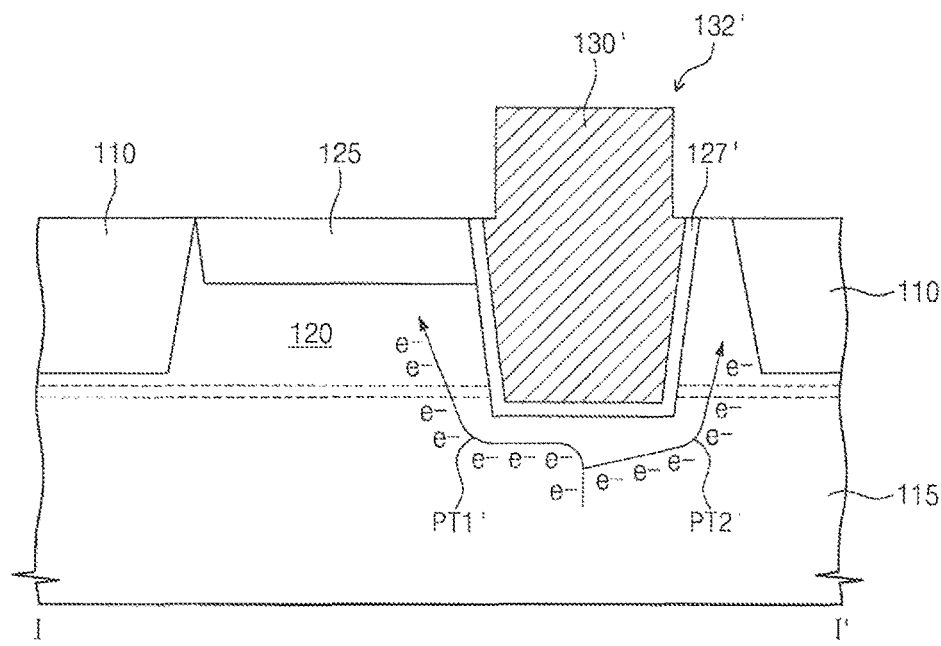
FIG. 6 is a sectional view taken along line I-I' of FIG. 5.
Figure 7:
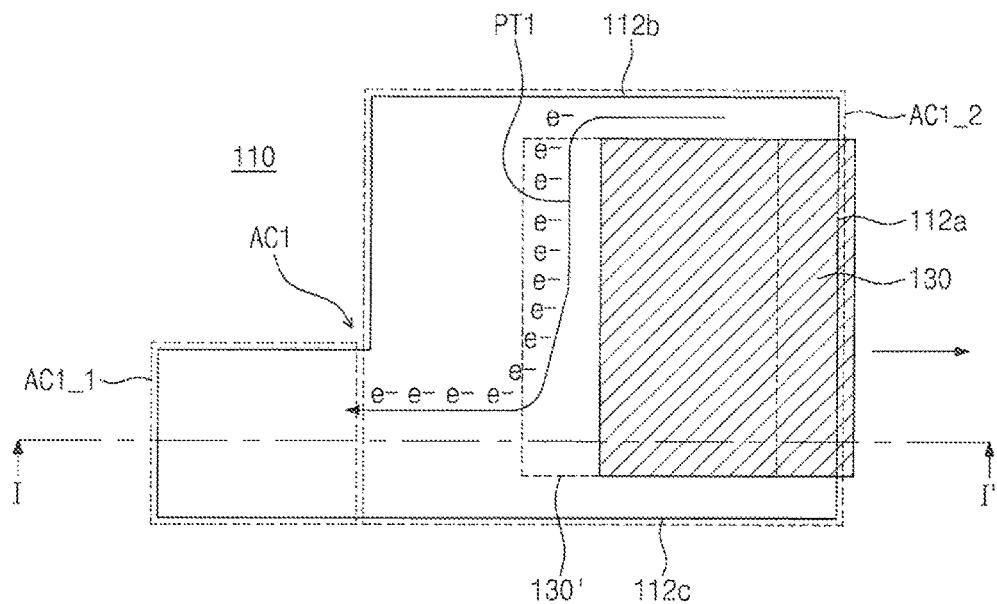
FIG. 7 is a plan view illustrating relative positions of an active region and a transfer gate of an image sensor according to some embodiments of the inventive concepts.
Figure 8:
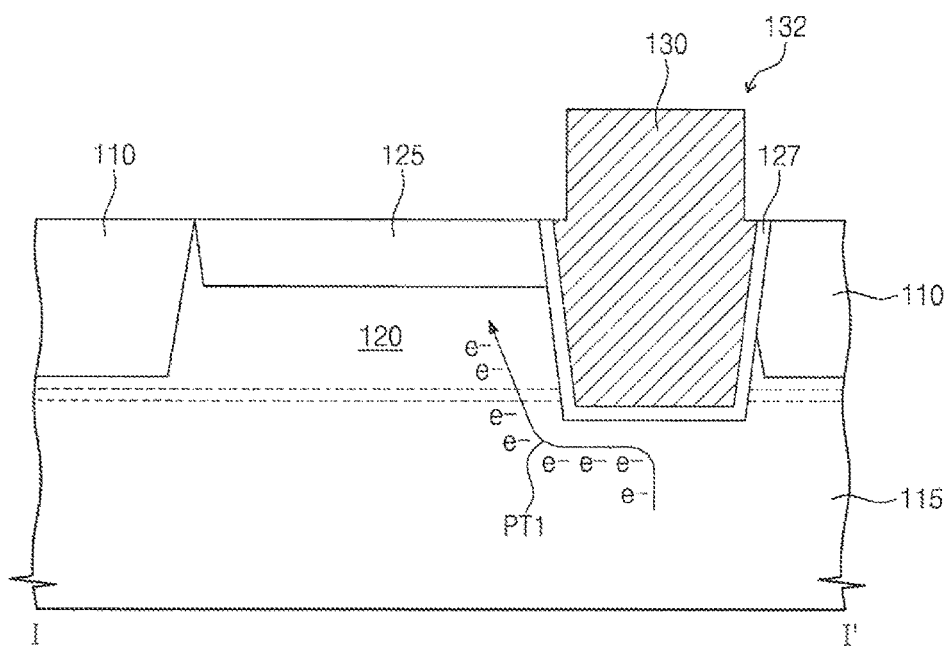
FIG. 8 is a sectional view taken along line I-I' of FIG. 7.

FIG. 5 is a plan view illustrating relative positions of an active region and a transfer gate of a conventional image sensor, and FIG. 6 is a sectional view taken along line I-I' of FIG. 5. FIG. 7 is a plan view illustrating relative positions of an active region and a transfer gate of an image sensor according to some embodiments of the inventive concepts, and FIG. 8 is a sectional view taken along line I-I' of FIG. 7.

When viewed in a plan view, the active region AC1 may include the first portion AC1_1 and the second portion AC1_2 connected to each other, and the second portion AC1_2 may be provided to have a width greater than that of the first portion AC1_1. The first portion AC1_1 may be disposed to have at least one side that is connected in a straight line with at least one side of the second portion AC1_2. In other words, the first portion AC1_1 may be disposed to have at least one side that is coplanar with at least one side of the second portion AC1_2. The second portion AC1_2 may include a first end portion 112a, which is provided at an opposite side of the first portion AC1_1 to face a neighboring one of the pixel regions PX, a second end portion 112b adjacent the second active region AC2, and a third end portion 112c adjacent the third active region AC3. The active region AC1 may be enclosed and defined by the device isolation layer 110. The active region AC1 and the device isolation layer 110 of FIGS. 5 to 8 may correspond to the first active region AC1 and the second device isolation layer 110, respectively, of FIGS. 3 and 4.

Referring to FIGS. 5 and 6, the transfer gate electrode 130' of a transfer gate 132' in a conventional image sensor may be provided in the second portion AC1_2 of the active region AC1 but may be spaced apart from the first, second, and third end portions 112a, 112b, and 112c of the active region AC1. In other words, in a conventional image sensor, the transfer gate electrode 130' and/or the gate insulating layer 127' of the transfer gate 132' may be spaced apart from the device isolation layer 110. In contrast, referring to FIGS. 7 and 8, the transfer gate electrode 130 according to embodiments of the inventive concepts may be shifted toward a side portion of the second portion AC1_2 of the active region AC1. In some embodiments of the inventive concepts, the transfer gate electrode 130 may be shifted toward the first end portion 112a of the active region AC1 in such a way that the transfer gate 132 is in contact with a portion of the device isolation layer 110 adjacent to the first end portion 112a.

The photoelectric conversion layer 115 may be configured to generate and hold photocharges whose amount is proportional to an amount of light incident therein. The transfer gate electrode 130 (FIGS. 7 and 8) or 130' (FIGS. 5 and 6) may be used to transfer the photocharges from the photoelectric conversion layer 115 to the floating diffusion region 125. As described herein, the floating diffusion region 125 may be formed in the first portion AC1_1 of the active region AC1.

As shown in FIGS. 5 and 6, in a conventional image sensor the photocharges may be moved along a first path PT1' toward the floating diffusion region 125 and a second path PT2' toward the first end portion 112a of the second portion AC1_2.

In contrast, as shown in FIGS. 7 and 8, the transfer gate 132 according to some embodiments of the inventive concepts may be provided to be in contact with the device isolation layer 110, thereby preventing the second path PT2' from being produced or reducing the area of the second path PT2'. Such a disposition of the transfer gate electrode 130 may make it possible to increase an area of a first path PT1 in a transfer gate 132 according to some embodiments of the inventive concepts. Accordingly, it may be possible to reduce loss of the photocharges that may occur when the photocharges move along the second path PT2'. Consequently, embodiments of the inventive concepts may realize a highly sensitive image sensor capable of obtaining an improved image in a low illumination environment.

Figure 9:
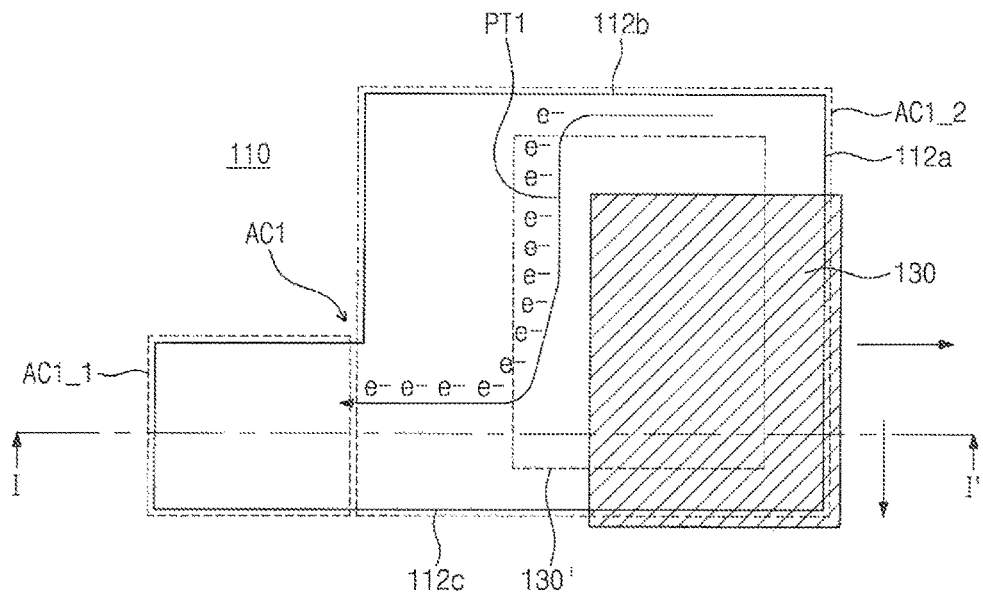
FIG. 9 is a plan view illustrating relative positions of an active region and a transfer gate of an image sensor according to some embodiments of the inventive concepts.

FIG. 9 is a plan view illustrating relative positions of an active region AC1 and a transfer gate 132 of an image sensor according to some embodiments of the inventive concepts, and a sectional shape of the image sensor of FIG. 9 will be described with reference to FIG. 8. For concise description, an element previously described with reference to FIGS. 3, 4, 7, and/or 8 may be identified by a similar or identical reference number without repeating an overlapping description thereof.

Referring to FIGS. 8 and 9, the transfer gate electrode 130 may be shifted toward the first and third end portions 112a and 112c of the active region AC1, when compared with that of FIG. 5. For example, the transfer gate 132 may be provided to be in contact with the device isolation layer 110, which is adjacent to the first and third end portions 112a and 112c. FIG. 9 illustrates the potential positioning of the gate electrode 130 as contrasted with the gate electrode 130' of FIG. 5 (illustrated as a dotted line for comparison). As described herein with respect to FIG. 8, such a configuration as that illustrated in FIG. 9 may reduce or eliminate the second path PT2'. Accordingly, it may be possible to reduce or eliminate a loss of the photocharges that may occur when the photocharges move along the second path PT2', and consequently to increase a width of the first path PT1. That is, it may be possible to increase a width of a current path for transferring the photocharges.

Figure 10:
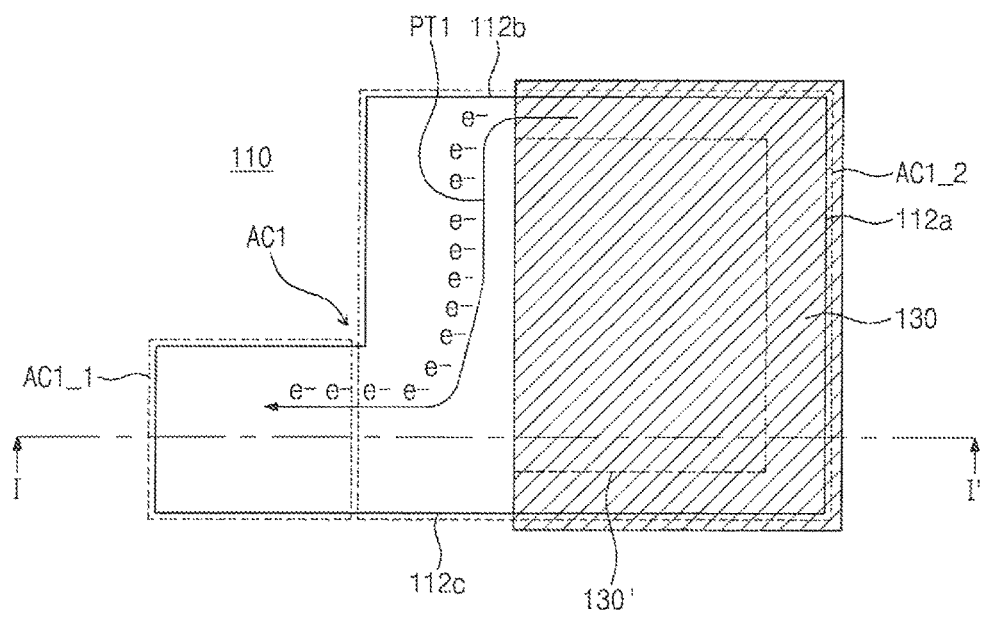
FIG. 10 is a plan view illustrating relative positions of an active region and a transfer gate of an image sensor according to some embodiments of the inventive concepts.

FIG. 10 is a plan view illustrating relative positions of an active region AC1 and a transfer gate 132 of an image sensor according to some embodiments of the inventive concepts, and a sectional shape of the image sensor of FIG. 11 will be described with reference to FIG. 8. For concise description, an element previously described with reference to FIGS. 3, 4, 7, and/or 8 may be identified by a similar or identical reference number without repeating an overlapping description thereof.

Referring to FIGS. 8 and 10, when contrasted with that of FIG. 5, the transfer gate electrode 130 may be provided to have an increased planar area. For example, when viewed in a plan view, the transfer gate 132 may be overlapped with the first, second, and third end portions 112a, 112b, and 112c of the active region AC1, thereby being in contact with the device isolation layer 110, which is adjacent to the first, second, and third end portions 112a, 112b, and 112c. FIG. 10 illustrates the potential positioning of the gate electrode 130 as contrasted with the gate electrode 130' of FIG. 5 (illustrated as a dotted line for comparison). As described herein with respect to FIG. 8, such a configuration as that illustrated in FIG. 10 may reduce or eliminate the second path PT2'. Accordingly, it may be possible to reduce or eliminate a loss of the photocharges that may occur when the photocharges move along the second path PT2', and consequently to decrease a length of the first path PT1.

Figure 11:
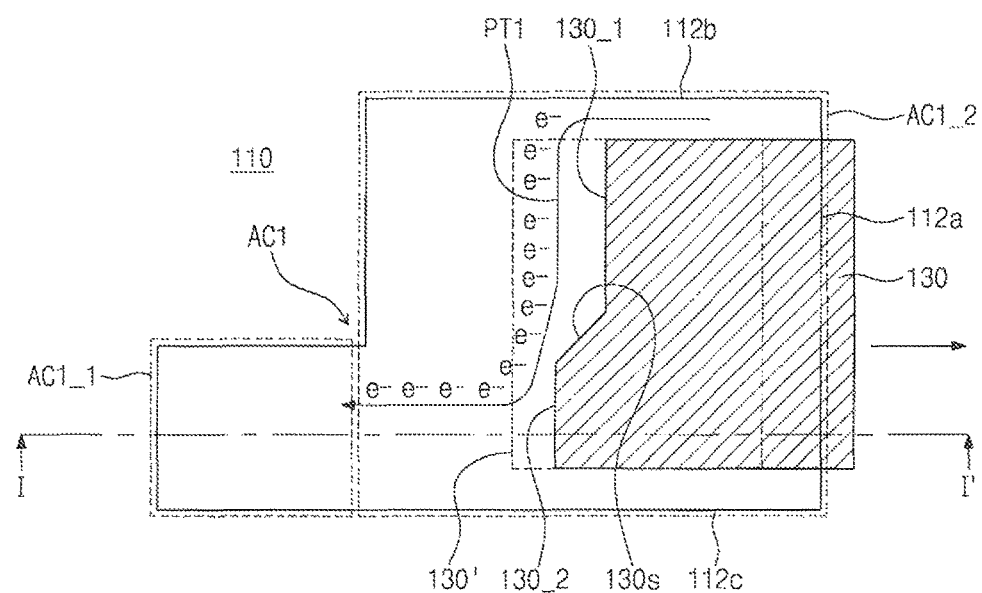
FIG. 11 is a plan view illustrating relative positions of an active region and a transfer gate of an image sensor according to some embodiments of the inventive concepts.

FIG. 11 is a plan view illustrating relative positions of an active region AC1 and a transfer gate 132 of an image sensor according to some embodiments of the inventive concepts, and a sectional shape of the image sensor of FIG. 11 will be described with reference to FIG. 8. For concise description, an element previously described with reference to FIGS. 3, 4, 7, and/or 8 may be identified by a similar or identical reference number without repeating an overlapping description thereof.

Referring to FIGS. 8 and 11, when viewed in a plan view, the transfer gate electrode 130 may be shifted toward the first end portion 112a of the active region AC1, and moreover, the transfer gate 132 may be provided to have a shape different from that of FIG. 5. In some embodiments, when viewed in a plan view, the transfer gate electrode 130 may have an inclined side 130S, which is provided adjacent the first portion AC1_1 and is inclined at an angle relative to the first portion AC1_1. For example, a left side of the transfer gate electrode 130 adjacent the first portion AC1_1 may be divided into three parts: 1) a first side 130_1 parallel to the first end portion 112a and adjacent the second end portion 112b, 2) a second side 130_2 parallel to the first end portion 112a and adjacent the third end portion 112c, and 3) the inclined side 130S between the first and second sides 130_1 and 130_2. FIG. 11 illustrates the potential positioning of the gate electrode 130 as contrasted with the gate electrode 130' of FIG. 5 (illustrated as a dotted line for comparison).

As shown in FIG. 11, the transfer gate electrode 130 may be provided to have an 'L' shape, in a plan view. Since the transfer gate electrode 130 is shifted toward the first end portion 112a, it may be possible to prevent the second path PT2' from being formed or reduce the area of the second path PT2'. In addition, since the transfer gate electrode 130 has the inclined side 130S, it may be possible to increase a width of the first path PT1 defined by the first side 130_1 of the transfer gate electrode 130.

According to some embodiments of the inventive concepts, a transfer gate may be provided to be in contact with a device isolation layer, and this may make it possible to allow photocharges to be transferred from a photoelectric conversion layer to a floating diffusion region through a single path. Accordingly, it may be possible to reduce or eliminate loss of photocharges and to realize a highly sensitive image sensor capable of obtaining an image under low illumination environment.

While example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
a substrate comprising an active region defined by a device isolation layer;
a photoelectric conversion layer in the substrate;
a floating diffusion region in the substrate at an edge of the active region; and
a transfer gate on the active region, the transfer gate being in contact with a portion of the device isolation layer adjacent the active region,
wherein the active region is a first active region and the image sensor further comprises a second active region and a third active region,
wherein the first active region is between the second and third active regions,
wherein the first active region comprises first and second portions connected to each other,
wherein the floating diffusion region is in the first portion of the first active region and the transfer gate is in the second portion of the first active region, and
wherein the second portion of the first active region comprises a first end portion at a side of the second portion that is opposite the first portion of the first active region, a second end portion that is adjacent the second active region, and a third end portion that is adjacent the third active region.

2. The image sensor of claim 1, wherein the substrate further comprises a well impurity layer,
wherein the floating diffusion region and the transfer gate are in the well impurity layer, and
wherein the transfer gate comprises a first portion inserted into the well impurity layer and a second portion connected to the first portion, the second portion protruding from the substrate in a direction perpendicular to a main surface of the substrate.

3. The image sensor of claim 1, wherein the transfer gate is in contact with a portion of the device isolation layer that is adjacent the first end portion of the second portion of the first active region.

4. The image sensor of claim 1, wherein the transfer gate is in contact with portions of the device isolation layer that are adjacent the first and third end portions of the second portion of the first active region.

5. The image sensor of claim 1, wherein the transfer gate is in contact with portions of the device isolation layer that are adjacent the first, second, and third end portions of the second portion of the first active region.

6. The image sensor of claim 1, wherein the transfer gate is in contact with the first end portion of the second portion of the first active region, and
wherein the transfer gate has a side that faces the first portion of the first active region and is inclined relative to the first portion of the first active region.

7. The image sensor of claim 1, wherein the second and third active regions have a same width and length.

8. The image sensor of claim 1,
wherein the second portion has a width greater than that of the first portion in a plan view.

9. The image sensor of claim 1, wherein the active region is an 'L'-shaped structure in a plan view.

10. An image sensor, comprising:
a substrate comprising a plurality of pixel regions defined by a first device isolation layer;
a transfer gate in the substrate;
logic transistors on a first surface of the substrate; and
a color filter layer and a micro lens on a second surface of the substrate opposite the first surface,
wherein at least one of the pixel regions comprises:
a first active region, a second active region, and a third active region defined by a second device isolation layer;
a photoelectric conversion layer in the substrate;
a well impurity layer adjacent the first surface of the substrate; and
a floating diffusion region in a first portion of the first active region,
wherein the transfer gate is in a second portion of the first active region,
wherein the second portion of the first active region comprises a first end portion at a side of the second portion of the first active region that is opposite the first portion of the first active region, and
wherein the transfer gate is in contact with a sidewall of the second device isolation layer adjacent the first end portion of the second portion of the first active region.

11. The image sensor of claim 10, wherein the logic transistors comprise gate electrodes on the second and third active regions.

12. The image sensor of claim 10, wherein the first active region is between the second and third active regions,
wherein the first portion of the first active region has a first width that is smaller than a second width of the second portion of the first active region, and
the first and second portions of the first active region have sides that are coplanar.

13. The image sensor of claim 12, wherein the second portion of the first active region further comprises a second end portion that is adjacent the second active region, and a third end portion that is adjacent the third active region.

14. The image sensor of claim 13, wherein the transfer gate is in contact with a sidewall of the second device isolation layer that is adjacent the third end portion of the second portion of the first active region.

15. An image sensor, comprising:
a substrate comprising a first surface and a second surface facing the first surface; and
a first device isolation layer in the substrate and extending between the first surface and the second surface that defines a pixel region comprising:
a photoelectric conversion layer that is in the substrate between the first surface and the second surface;
a second device isolation layer that is on the photoelectric conversion layer and between the photoelectric conversion layer and the first surface of the substrate;
a transfer transistor that is on the substrate and configured to transfer a charge from the photoelectric conversion layer; and
a transfer gate of the transfer transistor that is on the photoelectric conversion layer, the transfer gate comprising a first portion of the transfer gate that is in contact with the second device isolation layer,
wherein the pixel region comprises a first active region and a floating diffusion region that is in the first active region,
wherein the transfer gate is on the first active region,
wherein the floating diffusion region is at a first side of the transfer gate, and
wherein the first portion of the transfer gate contacts a sidewall of the second device isolation layer at a second side of the transfer gate that is opposite the first side of the transfer gate.

16. The image sensor of claim 15, wherein the pixel region further comprises a second active region and a third active region,
wherein the first active region is between the second active region and the third active region.

17. The image sensor of claim 16, wherein the transfer gate contacts the second device isolation layer at a first edge of the first active region,
wherein the floating diffusion region is in the first active region at a second edge of the first active region that is opposite the first edge of the first active region, and
wherein the transfer gate also contacts the second device isolation layer at a third edge of the first active region that is adjacent the first edge of the first active region.

18. The image sensor of claim 16, wherein the transfer gate comprises a gate electrode with a side adjacent the floating diffusion region that comprises a first segment, a second segment and a third segment,
wherein the second segment of the side of the gate electrode is inclined at an angle relative to the floating diffusion region,
wherein the first segment of the side of the gate electrode is between the second segment and the second active region, and
wherein the third segment of the side of the gate electrode is between the second segment and the third active region.

* * * * *